United States Patent
Kuramoto et al.

(10) Patent No.: US 8,466,416 B2
(45) Date of Patent: Jun. 18, 2013

(54) ELECTRON DETECTING MECHANISM AND CHARGED PARTICLE BEAM SYSTEM EQUIPPED THEREWITH

(75) Inventors: Tatsuru Kuramoto, Tokyo (JP); Makoto Aoshima, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 13/424,808

(22) Filed: Mar. 20, 2012

(65) Prior Publication Data
US 2012/0241609 A1    Sep. 27, 2012

(30) Foreign Application Priority Data

Mar. 22, 2011 (JP) ................................. 2011-061996

(51) Int. Cl.
*H01J 37/244* (2006.01)
*H01J 37/147* (2006.01)
*H01J 37/09* (2006.01)

(52) U.S. Cl.
CPC ............... *H01J 37/244* (2013.01); *H01J 37/09* (2013.01)
USPC ........... 250/305; 250/306; 250/307; 250/309; 250/310; 250/311; 250/396 R; 250/397

(58) Field of Classification Search
CPC ......... H01J 37/244; H01J 37/05; H01J 37/147; H01J 2237/2449; H01J 2237/2448; H01J 2237/24475; H01J 2237/04756; H01J 2237/004; H01J 2237/24465; H01J 2237/05; H01J 2237/244
USPC ............. 250/306, 305, 310, 311, 307, 396 R, 250/397
See application file for complete search history.

(56) References Cited

U.S. PATENT DOCUMENTS

| | | | | |
|---|---|---|---|---|
| 4,962,306 A | * | 10/1990 | Hodgson et al. | 250/310 |
| 5,466,940 A | * | 11/1995 | Litman et al. | 250/397 |
| 6,646,262 B1 | * | 11/2003 | Todokoro et al. | 850/9 |
| 6,667,476 B2 | * | 12/2003 | Todokoro et al. | 850/9 |
| 6,847,038 B2 | * | 1/2005 | Todokoro et al. | 850/9 |
| 6,872,944 B2 | * | 3/2005 | Todokoro et al. | 850/9 |
| 6,885,001 B2 | * | 4/2005 | Ose et al. | 850/9 |
| 7,049,591 B2 | * | 5/2006 | Todokoro et al. | 250/310 |
| 7,075,078 B2 | * | 7/2006 | Ose et al. | 250/311 |
| 7,294,835 B2 | * | 11/2007 | Todokoro et al. | 250/310 |
| 7,399,966 B2 | * | 7/2008 | Todokoro et al. | 250/310 |
| 7,449,690 B2 | * | 11/2008 | Nishiyama et al. | 250/310 |
| 8,153,969 B2 | * | 4/2012 | Fukada et al. | 250/311 |

(Continued)

FOREIGN PATENT DOCUMENTS
WO          9946798 A1        9/1999

*Primary Examiner* — David A Vanore
(74) *Attorney, Agent, or Firm* — The Webb Law Firm

(57) ABSTRACT

An electron detecting mechanism having a plate provided with an opening permitting passage of the primary beam, an energy filter, a first light detector, and a second light detector. The plate has first and second scintillating surface on its opposite sides. The first scintillating surface faces a sample. The second scintillating surface faces the energy filter. When the primary beam hits the sample, electrons are produced and some of them impinge as first electrons on the first scintillating surface. Consequently, first scintillation light is produced and detected by the first light detector. At the same time, some of the electrons produced from the sample pass through the opening of the plate, are repelled by the energy filter, and impinge as second electrons on the second scintillating surface. As a result, second scintillation light is produced and detected by the second light detector.

10 Claims, 3 Drawing Sheets

U.S. PATENT DOCUMENTS

| | | | |
|---|---|---|---|
| 8,217,363 B2 * | 7/2012 | Hatano et al. | 250/396 ML |
| 8,334,508 B1 * | 12/2012 | Mankos | 250/305 |
| 8,350,213 B2 * | 1/2013 | Wang et al. | 250/310 |
| 2005/0133719 A1 * | 6/2005 | Todokoro et al. | 250/310 |
| 2005/0139773 A1 * | 6/2005 | Ose et al. | 250/311 |
| 2005/0279937 A1 * | 12/2005 | Koike et al. | 250/310 |
| 2006/0186351 A1 * | 8/2006 | Nishiyama et al. | 250/492.1 |
| 2007/0221846 A1 * | 9/2007 | Todokoro et al. | 250/310 |
| 2009/0184255 A1 * | 7/2009 | Fukada et al. | 250/396 R |
| 2009/0294665 A1 * | 12/2009 | Koike et al. | 250/310 |
| 2011/0163229 A1 * | 7/2011 | Frosien et al. | 250/310 |
| 2011/0215241 A1 * | 9/2011 | Wang et al. | 250/307 |
| 2011/0291010 A1 * | 12/2011 | Katane et al. | 250/310 |

* cited by examiner

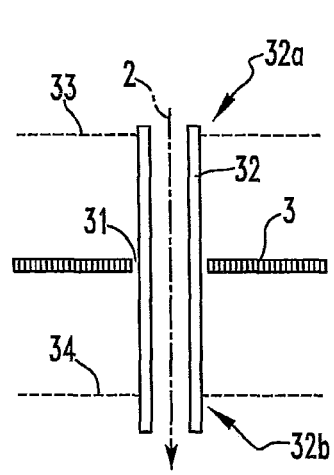
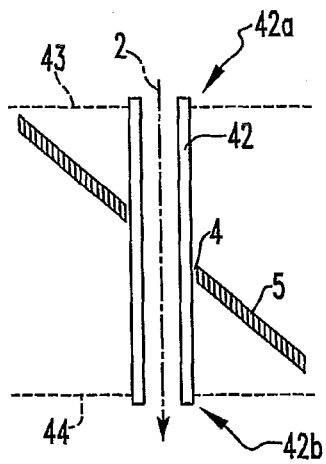
FIG.3  FIG.4
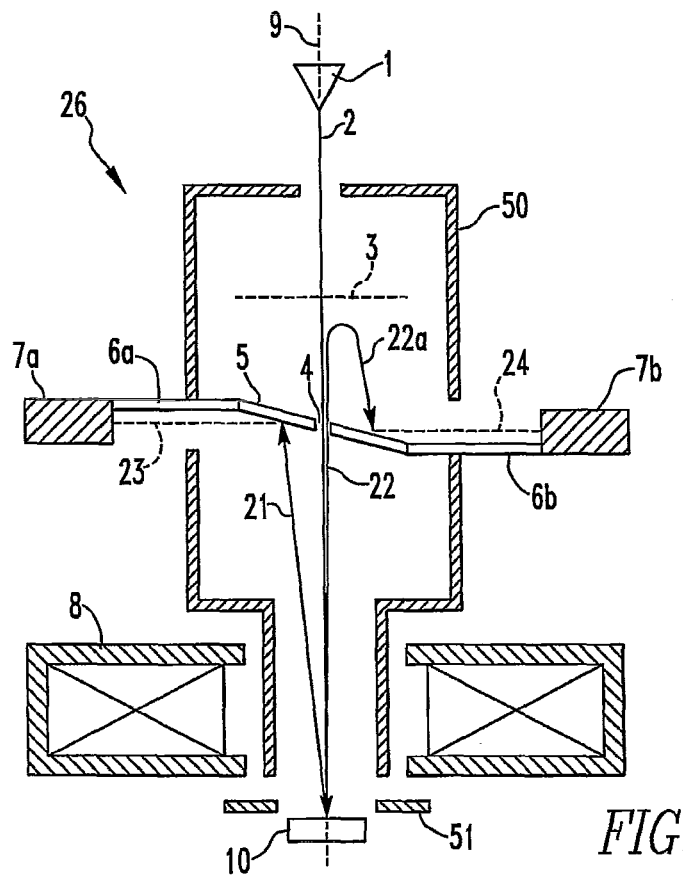
FIG.5

ELECTRON DETECTING MECHANISM AND CHARGED PARTICLE BEAM SYSTEM EQUIPPED THEREWITH

BACKGROUND OF THE INVENTION

1. Field of the Invention

The present invention relates to an electron detecting mechanism for use in a charged particle beam system such as a scanning electron microscope. The invention also relates to a charged particle beam system equipped with the electron detecting mechanism.

2. Description of Related Art

A scanning electron microscope forms an electron probe by focusing an electron beam onto a sample to be observed and inspected. The electron probe is raster-scanned over the sample.

The sample over which the probe is raster-scanned in this way emits secondary electrons and backscattered electrons which are to be detected. A scanned image is formed by synchronizing a brightness signal indicative of detected electrons and a scan signal for the electron probe during scanning.

FIG. 1 is a schematic block diagram showing one example of electron detecting mechanism for use in a scanning electron microscope. An electron beam source 101 consisting of an electron gun emits an accelerated beam 102 toward a sample 110. The beam 102 is then once focused by condenser lenses (not shown) and passes through an objective aperture (not shown). The beam then passes through an opening 107a in a metal sheet or plate 107 used to emit secondary electrons. The optical axis of the beam 102 is indicated by numeral 109.

The electron beam 102 passed through the opening 107a in the metal plate 107 is focused onto the sample 110 by the focusing action of an objective lens 108. As a result, an electron probe focused over the sample 110 is formed. Under this condition, the probe is raster-scanned over the sample 110 scan coils (not shown).

The sample 110 over which the electron probe is scanned in this way emits electrons to be detected, including secondary electrons (SE) 103 of lower energies and backscattered electrons (BS) 104 of higher energies.

The secondary electrons 103 produced from the sample 110 directly reach the electron-sensitive portion 106a of an electron detector 106. The sensitive portion 106a produces an electric field which is so weak that the trajectory of the electron beam 102 being the primary beam is not affected.

The secondary electrons 103 from the sample 110 are pulled to the electron-sensitive portion 106a by the electric field. Consequently, the secondary electrons 103 directly reach the electron-sensitive portion 106a and are detected by the detector 106.

On the other hand, the backscattered electrons 104 produced from the sample 110 have energies equivalent to energies of the electron beam 102 based on the accelerating voltage and so the trajectory is hardly affected by the electric field. As a result, the backscattered electrons 104 travel straight and collide against the metal plate 107.

The collision of the backscattered electrons 104 emits electrons from the metal plate 107. The emitted electrons include secondary electrons 105 which are attracted toward the electron-sensitive portion 106a of the electron detector 106 by the electric field. In consequence, the secondary electrons 105 released from the metal plate 107 are detected by the detector 106.

As a result, the secondary electrons 103 produced from the sample 110 and the secondary electrons 105 responsive to the backscattered electrons 104 produced from the sample 110 are simultaneously detected by the electron detector 106. In this case, the secondary electrons 103 and 105 are concurrently detected by the electron detector 106.

Another example of the electron detecting mechanism is described, for example, in WO 1999/046798 and has two electron detectors juxtaposed along an optical axis. Secondary electrons released from the sample are detected by one of the electron detectors located on the lower side. Secondary electrons produced in response to backscattered electrons colliding against a reflective plate located on the beam side are detected by the other electron detector located on the upper side.

In the aforementioned detecting mechanisms, the range of energies of electrons made to impinge on the corresponding electron detector can be varied by applying a voltage on the metal plate or reflective plate.

Especially, the latter structure described in WO 1999/046798 has the following advantage. If a voltage is applied to the reflective plate and if secondary electrons produced from the reflective plate are detected while varying the voltage, the detection of secondary electrons by the lower electron detector located closer to the sample is not affected thereby, because secondary electrons emanating from the sample and secondary electrons emanating from the reflective plate are detected by respective electron detectors.

In the former structure shown in FIG. 1, information carried by the secondary electrons emanating from the sample and information carried by the backscattered electrons is superimposed and detected by an electron detector. Therefore, in this structure, it has been difficult to separate the information carried by the secondary electrons from the information carried by the backscattered electrons and to detect these two kinds of information.

In the latter structure, secondary electrons emanating from the sample and backscattered electrons are detected by separate detectors and so two kinds of information based on these two types of electrons detected can be detected individually. However, regarding backscattered electrons originating from the sample, it has been difficult to separate information carried by backscattered electrons in orbits close to the optical axis of the primary beam from information carried by backscattered electrons in more external orbits and to detect these two kinds of information.

It may be conceivable to add a separate electron detector located on the upper side to the latter structure. The added detector is arranged vertically along the optical axis. Hence, the number of electron detector stages increases. This would increase the space occupied by the charged particle optical system having an electron detecting mechanism.

If the number of electron detectors is increased to thereby increase the space occupied by the charged particle optical system in this way, the size of the whole equipment is increased. In addition, the charged particle optical system is more susceptible to external disturbances, which needs to be improved.

SUMMARY OF THE INVENTION

In view of the foregoing, the present invention has been made. It is an object of the present invention to provide a space-saving electron detecting mechanism which can separate second electrons in orbits close to the optical axis of a primary beam from first electrons in more external orbits such that the first and second electrons can be detected separately with a simple structure. It is another object of the invention to provide a charged particle beam system equipped with this electron detecting mechanism.

It is a further object of the invention to provide an electron detecting mechanism which is of the same structure as the mechanism described in the immediately preceding paragraph and which can vary the range of energies of the detected first electrons. It is a yet other object of the invention to provide a charged particle beam system having this electron detecting mechanism.

An electron detecting mechanism according to one embodiment of the present invention has: a plate having an opening located on the optical axis of a primary beam accelerated and released from a charged particle beam source, the opening permitting passage of the primary beam; first and second scintillating surfaces formed on opposite sides of the plate; an energy filter located between the charged particle beam source and the plate and having an opening permitting passage of the primary beam; a first light detector for detecting first scintillation light; and a second light detector for detecting second scintillation light. The first scintillating surface of the plate faces a sample. The second scintillating surface faces the energy filter. When the primary beam hits the sample, electrons are produced from the sample and some of them impinge as first electrons on the first scintillating surface, producing the first scintillation light. At the same time, some of the electrons produced from the sample pass through the opening in the plate, are repelled by the energy filter, and impinge as second electrons on the second scintillating surface, producing the second scintillation light.

A charged particle beam system according to another embodiment of the present invention has a charged particle beam source for producing an accelerated primary beam, an objective lens for focusing the primary beam onto a sample, and a deflector for scanning the focused primary beam over the sample. The charged particle beam system further includes the aforementioned electron detecting mechanism. At least any one type of the first and second electrons is detected by the electron detecting mechanism, and the corresponding light detector produces an output signal. Based on this output signal, a scanned image is created.

The electron detecting mechanism of the present invention has the plate provided with the opening through which the primary beam passes, the energy filter disposed between the charged particle beam source and the plate, the first light detector for detecting the first scintillation light, and the second light detector for detecting the second scintillation light. The plate has the first and second scintillating surfaces on its opposite sides. The energy filter has the opening permitting passage of the primary beam. The first scintillating surface of the plate faces the sample. When the first electrons directly reaching the plate from the sample hit the first scintillating surface, the first scintillation light is produced. The second scintillating surface of the plate is located opposite to the energy filter. Electrons which are produced from the sample and passed through the opening in the plate are repelled by the energy filter. When these second electrons impinge on the second scintillating surface, the second scintillation light is produced.

In the present invention, because of this configuration, information carried by the second electrons in orbits close to the optical axis of the primary beam can be detected by the second light detector, and information carried by the first electrons in more external orbits can be detected by the first light detector, without juxtaposing electron detectors vertically along the optical axis of the primary beam.

Consequently, when the first and second electrons are individually detected, it is not necessary to dispose electron detectors in multiple stages. This makes it unnecessary to secure a large space to accommodate the charged particle optical system equipped with the electron detecting mechanism. Thus, the charged particle optical system can be made less susceptible to external disturbances.

Furthermore, the charged particle beam system equipped with the electron detecting mechanism of the present invention can achieve space saving.

Additionally, in the electron detecting mechanism of the present invention, when the second electrons are detected, the range of energies of detected energies can be varied by controlling the voltage applied to the energy filter.

BRIEF DESCRIPTION OF THE DRAWINGS

FIG. 3 is a schematic enlarged cross section of the electron detecting mechanism shown in FIG. 2, and in which an energy filter according to the invention is disposed;

FIG. 4 is a schematic enlarged cross section of the electron detecting mechanism shown in FIG. 2, and in which a plate according to the invention is disposed; and FIG. 5 is a schematic block diagram of modified examples of the electron detecting mechanism and charged particle beam system of the invention.

DESCRIPTION OF THE PREFERRED EMBODIMENTS

Figure 1:
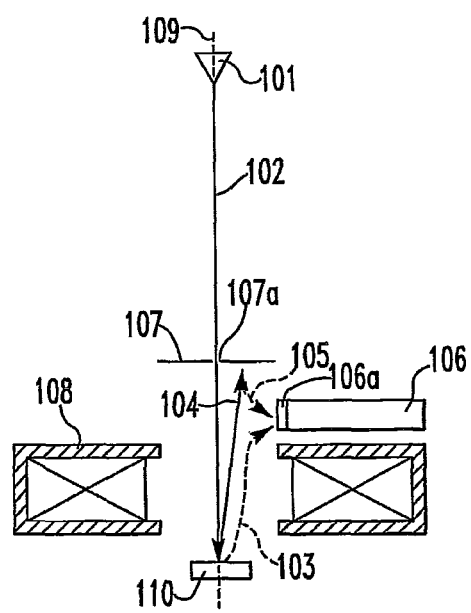
FIG. 1 is a schematic vertical cross section of one conventional electron detecting mechanism.
Figure 2:
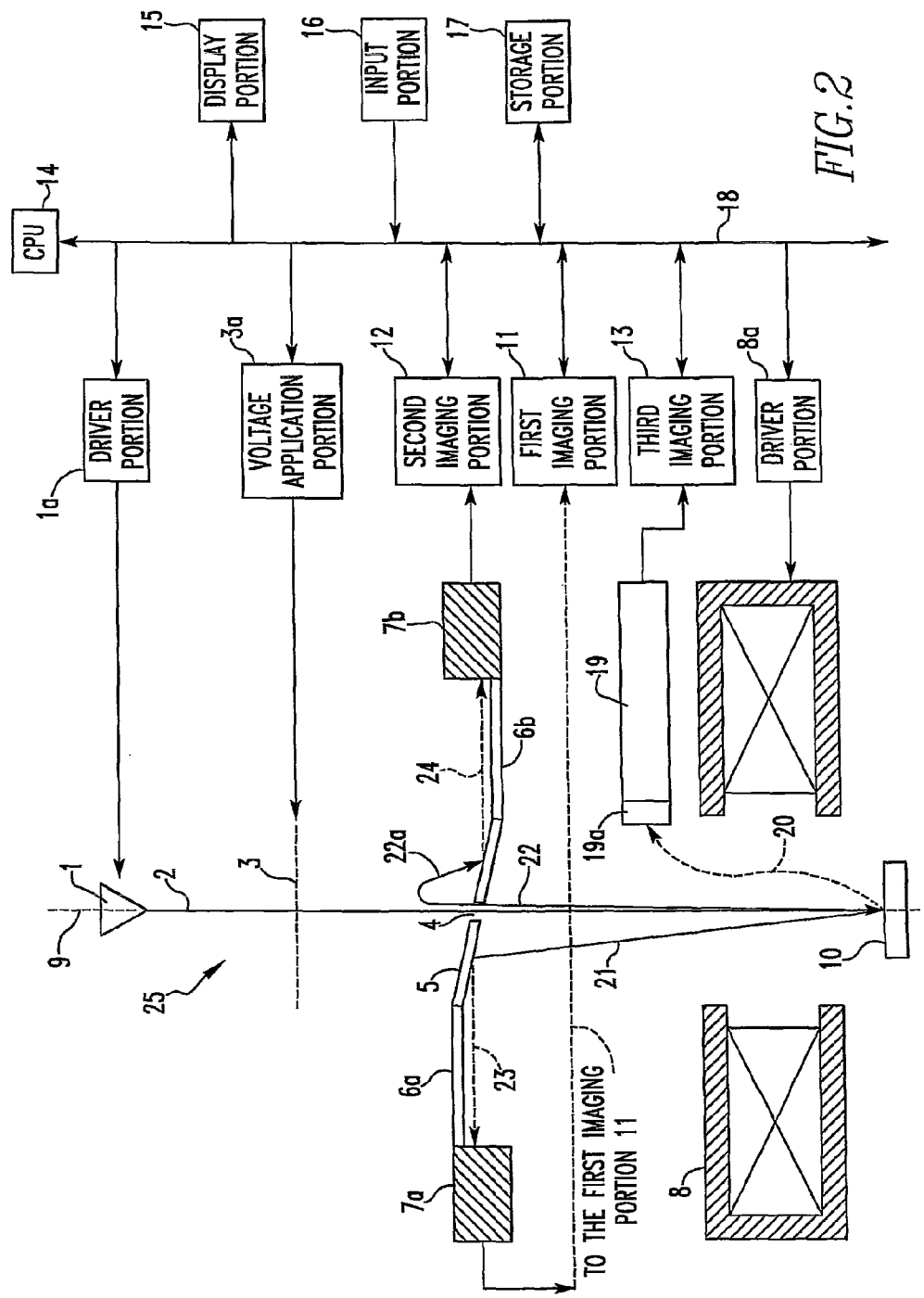
FIG. 2 is a schematic block diagram of an electron detecting mechanism and charged particle beam system according to the present invention.

The preferred embodiments of the present invention are hereinafter described with reference to the drawings. FIG. 2 is a schematic block diagram of an electron detecting mechanism and charged particle beam system according to embodiments of the present invention.

In FIG. 2, an electron beam source 1 that is a charged particle beam source and consists of an electron gun emits an accelerated electron beam 2 (charged particle beam) as a primary beam toward a sample 10. The released beam 2 is once focused by condenser lenses (not shown) and passes through an objective aperture (not shown). The beam then passes through an energy filter 3 made of a metal mesh or metal plate. The filter 3 is provided with an opening permitting passage of the beam 2, which has an optical axis 9 passing through the opening in the energy filter 3.

The electron beam 2 transmitted through the energy filter 3 passes through an opening 4 in a plate 5. The beam is then focused onto the sample 10 by the focusing action of an objective lens 8. Consequently, a focused electron probe is formed on the sample 10. Under this condition, the probe is raster-scanned over the sample 10 by a deflector (not shown). The optical axis 9 of the beam 2 extends through the opening 4 in the plate 5.

Secondary electrons 20 and backscattered electrons 21, 22 are produced from the sample 10 scanned with the electron probe (electron beam 2) in this way. The secondary electrons 20 emanating from the sample 10 directly reach the electron-sensitive portion 19a of an electron detector 19, whereby the electrons are detected. The electron-sensitive portion 19a of the detector 19 develops an electric field which is so weak that the orbit of the electron beam 2 being a primary beam is not affected. The secondary electrons 20 emanating from the sample 10 are pulled by the electric field and reach the electron-sensitive portion 19a.

On the other hand, the backscattered electrons 21, 22 emanating from the sample 10 have energies equivalent to energies of the electron beam 2 imparted based on the accelerating voltage. The orbit is hardly affected by the electric field. As a result, the electrons pass ahead of the electron-sensitive portion 19a of the electron detector 19 for detection of secondary electrons and go straight intact.

Of these backscattered electrons 21, 22, the backscattered electrons 21 (herein referred to as the first electrons) in orbits outside a given region close to the optical axis 9 reach the lower surface of the plate 5.

The front and rear surfaces (upper and lower surfaces) of the plate 5 form scintillating surfaces and are tilted at angles of 40 to 50 degrees to the optical axis 9. The most preferable tilt angle is 45 degrees.

The scintillating surfaces are formed by either applying a fluorescent paint to the surface of the specular or white body of the plate or adhesively bonding a fluorescent material to the surface of the body. The body of the plate is made of a conductive member. A voltage can be applied across the body of the plate by a voltage application means (not shown).

The body of the plate 5 is disklike in shape. One side surface of the body is supported to a first light detector 7a via a support plate 6a having a specular lower surface. The other side surface of the body of the plate 5 is supported to a second light detector 7b via a support plate 6b having a specular upper surface.

The first light detector 7a and second light detector 7b are connected with a first imaging portion 11 and a second imaging portion 12, respectively. The imaging portions 11 and 12 are connected with a CPU 14 via a bus line 18.

An electron detector 19 for detection of secondary electrons is connected with a third imaging portion 13, which in turn is connected with the CPU 14 also via the bus line 18.

The electron beam source 1 is connected with a driver portion 1a, which in turn is connected with the CPU 14 via the bus line 18. Thus, the electron beam source 1 is driven by the driver portion 1a under control of the CPU 14.

The energy filter 3 is connected with a voltage application portion 3a, which in turn is connected with the CPU 14 via the bus line 18. Thus, a voltage is applied to the energy filter 3 by the voltage application portion 3a under control of the CPU 14.

The objective lens 8 is connected with a driver portion 8a, which in turn is connected with the CPU 14 via the bus line 18. The objective lens 8 is driven by the driver portion 8a under control of the CPU 14.

The condenser lenses (not shown) and the deflector (not shown) are driven by their respective driver portions (not shown) under control of the CPU 14.

A display portion 15, an input portion 16, and a storage portion 17 are connected with the bus line 18, which in turn is connected with the CPU 14. The display portion 15 has a display device made of an LCD, CRT, or the like. The input portion 16 has a key entry device such as a keyboard and a pointing device such as a mouse. The storage portion 17 is used to store data about scanned images produced based on scanning of the electron beam 2 over the sample 10. Indicated by numeral 25 is an electron optical system (charged particle optical system).

Backscattered electrons 21 and 22 are produced from the sample 10 in response to the scanning of the focused electron beam 2 as described previously. When the first backscattered electrons 21 in orbits outside a given region close to the optical axis 9 reach the lower surface of the plate 5, first scintillation light 23 is produced from the lower surface. The light 23 travels to the left as viewed in the figure under the support plate 6a and reaches the first light detector 7a, where the light is detected.

Since the lower surface of the support plate 6a is specular, the scintillation light 23 traveling obliquely up and to the left as viewed in the figure is reflected by the specular surface. It is ensured that the light reaches the first light detector 7a. If a separate specular member (not shown) is disposed opposite to the specular lower surface of the support plate 6a, the scintillation light 23 reflected off the lower surface of the support plate 6a is further reflected by the specular member. This further assures that the light hits the first light detector 7a.

A brightness signal produced from the first light detector 7a is sent to the first imaging portion 11. A scan signal is supplied from the CPU 14 to a driver portion (not shown) connected with the deflector to scan the electron beam 2. This scan signal is also sent to the first imaging portion 11. First image data is created by synchronizing the scan signal and the brightness signal.

The first image data is stored in the storage portion 17 from the first imaging portion 11 via the bus line 18 under control of the CPU 14.

Of the aforementioned backscattered electrons 21 and 22, the second backscattered electrons 22 in orbits within the given region close to the optical axis 9 pass through the opening 4 in the plate 5. That is, the internal region of the opening 4 in the plate 5 through which the optical axis 9 passes is the given region.

Ground potential or a given negative potential, for example, of approximately 0 V to −2,000 V is applied to the energy filter 3 located above the plate 5 by the voltage application portion 3a. Backscattered electrons 22a which are included in the backscattered electrons 22 passed through the opening 4 in the plate 5 and which are responsive to accelerating voltages lower than the above-described applied voltage are repelled toward the sample 10 by the electric field developed by the voltage. The sample 10 is at ground potential.

The repelled electrons 22a reach the upper surface of the plate 5, giving rise to second scintillation light 24 from the upper surface. The second scintillation light 24 travels to the right as viewed in the figure above the support plate 6b and reaches the second light detector 7b, where the light is detected.

Since the upper surface of the support plate 6b is specular, the scintillation light 24 traveling obliquely down and to the right as viewed in the figure is reflected by the specular surface and reaches the second light detector 7b with certainty. If a separate specular member (not shown) is disposed opposite to the specular upper surface of the support plate 6b, the scintillation light 24 reflected off the upper surface of the support plate 6b is further reflected by the specular member and hits the second light detector 7b with greater certainty.

The brightness signal from the first light detector 7b is fed to the second imaging portion 12, which is also supplied with the scanning signal for the electron beam 2. Second image data is created by synchronizing the scan signal and the brightness signal. The second image data is stored in the storage portion 17 from the second imaging portion 12 via the bus line 18 under control of the CPU 14.

Third image data (representing a secondary electron image) created in response to detection of the secondary electrons 20 by the electron detector 19 is created by the third imaging portion in the same way as the foregoing. The third image data is stored in the storage portion 17 via the bus line 18.

The first image data obtained based on the backscattered electrons 21 includes topographic information and compositional information about the surface of the sample 10. The second image data obtained based on the backscattered electrons 22 in orbits around the optical axis 9 consist only of compositional information from which most of the topographic information about the surface of the sample 10 has been removed. The third image data obtained based on the secondary electrons 20 is image data in which the topographic information about the surface of the sample 10 is mainly reflected.

The operator of the present system can select any desired image data stored in the storage portion 17 by manipulating the input portion 16. An image represented by the selected image data can be displayed on the display portion 15 of the system. The image displayed in this way is not limited to one in number. Plural images can also be displayed simultaneously on the display portion 15.

The given negative potential is applied to the energy filter 3 by the voltage application portion 3a as described previously. This may affect the electron beam 2 accelerated by the given accelerating voltage.

A structure for reducing such effects is shown in FIG. 3, where a metal pipe 32 is inserted in the opening 31 of the energy filter 3 through which the electron beam 2 passes. The pipe 32 is at ground potential and has outer peripheral portions 32a and 32b on its both ends. Metal meshes 33 and 34 are mounted to the peripheral portions 32a and 32b, respectively, so as to cover the upper and lower surfaces of the energy filter 3. The meshes 33 and 34 are electrically connected with the metal pipe 32.

A shield member made up of the metal pipe 32 and metal meshes 33, 34 at ground potential can reduce the effects of the electric field produced by the energy filter 3 on the electron beam 2.

In the above embodiment, secondary electrons emanating from the sample 10 are detected by the electron detector 19. The backscattered electrons 21 and 22 emanating from the sample 10 are detected via the plate 5 while maintaining the plate 5 at ground potential.

Alternatively, low-energy electrons such as secondary electrons may be detected via the plate 5 while applying a positive potential, for example, of about 8 kV to 10 kV to the plate 5. Also in this case, it is necessary to reduce the effects of the applied positive potential on the electron beam 2.

A structure for achieving this necessity is shown in FIG. 4, where a metal pipe 42 is inserted in the opening 4 of the plate 5 through which the electron beam 2 passes, the pipe 42 being at ground potential. The metal pipe 42 has outer peripheral portions 42a and 42b on its both ends. Metal meshes 43 and 44 are mounted to the peripheral portions 42a and 42b, respectively, and cover the upper and lower surfaces of the plate 5. The meshes 43 and 44 are electrically connected with the metal pipe 42.

A shield member made up of the metal pipe 42 and metal meshes 43, 44 at ground potential can reduce the effects of the electric field produced by the plate 5 on the electron beam 2.

A modification of the above embodiment of the present invention is next described by referring to FIG. 5, which is a schematic block diagram of modified examples of the electron detecting mechanism and charged particle beam system of the invention. In FIGS. 2 and 5, like components are indicated by like reference numerals.

In FIG. 5, an electron optical system (charged particle optical system) 26 is similar to the electron optical system 25 shown in FIG. 2 except that an accelerator tube 50 and a decelerating electrode 51 are added. The accelerator tube 50 is used to further accelerate the electron beam 2 that has been accelerated and released from the electron beam source 1. The tube 50 is a tubular member extending from immediately below the lower stage of the electron beam source 1 into the objective lens 8. The beam 2 passes through the accelerator tube 50. A given positive potential, for example, of about 8 kV to 10 kV is applied to the accelerator tube 50 relative to ground potential. The beam 2 accelerated and released from the electron beam source 1 is further accelerated by the applied positive potential.

Since the electron beam 2 is further accelerated inside the accelerator tube 50, aberrations produced in the electron optical system 26 can be reduced.

The decelerating electrode 51 is disposed between the lower front end of the accelerator tube 50 and the sample 10 and provided with an opening through which the electron beam 2 passes. A given decelerating voltage, for example, of −500 V to +500 V is applied to the decelerating electrode 51. Alternatively, the electrode 51 may be set at ground potential.

The electron beam 2 passed through the accelerator tube 50 is decelerated by the decelerating voltage applied to the decelerating electrode 51 and reaches the sample 10.

In this modification, the voltage applied to the plate 5 disposed inside the accelerator tube 50 is equal to the voltage applied to the accelerator tube 50. Since the plate 5 and accelerator tube 50 are at equipotential, the plate 5 dispenses with the shield member shown in FIG. 4. However, the shield member made of the metal pipe 32 and metal meshes 33, 34 shown in FIG. 3 is arranged on the energy filter disposed inside the accelerator tube 50. This shield member is at equipotential with the accelerator tube 50.

The electron detector 19 for detecting secondary electrons emanating from the sample 10 as shown in FIG. 2 is omitted in FIG. 5. Also in this modified embodiment, the first electrons 21 in orbits outside a given region close to the optical axis 9 and the second electrons 22 in orbits in the given region close to the optical axis 9 can be separately detected, in the same way as in the embodiment shown in FIG. 2.

The electron detecting mechanism of the present invention has: the plate 5 disposed on the optical axis 9 of the primary beam 2 accelerated and released from the charged particle beam source 1, the energy filter 3 placed between the charged particle beam source 1 and the plate 5 having the opening 4 permitting passage of the primary beam 2, the first light detector 7a for detecting the first scintillation light 23, and the second light detector 7b for detecting the second scintillation light 24. The plate has the first and second scintillating surfaces on its opposite sides. The filter 3 is provided with the opening through which the primary beam 2 passes. When the primary beam 2 hits the sample 10, the first electrons 21 are produced from the sample 10. When the first electrons 21 reach the first scintillating surface of the plate 5 located opposite to the sample 10, the first scintillation light 23 is produced. At the same time, some of the electrons produced from the sample 10 pass through the opening 4 in the plate 5 and are repelled by the energy filter 3, producing the second electrons 22a. When the second electrons 22a reach the second scintillating surface of the plate 5 located opposite to the energy filter 3, the second scintillation light 24 is produced.

The scintillating surfaces of the plate 5 are tilted at angles of 40 to 50 degrees to the optical axis 9 of the primary beam 2.

The scintillating surfaces of the plate 5 are formed by applying a fluorescent paint to the surface of the specular or white body of the plate or adhesively bonding a fluorescent material to the surface of the body. The body of the plate 5 is made of a conductive member. A voltage can be applied to the body of the plate.

The metal pipe 42 at ground potential is disposed within the opening 4 of the plate 5. The metal meshes 43 and 44 can be mounted to the outer peripheral portions 42a and 42b at the opposite ends of the metal pipe 42 so as to cover the plate 5.

The energy filter 3 is made of a metal grid, plate, or sheet to which a voltage can be applied. The metal pipe 32 at ground potential is disposed in the opening 31 of the filter 3. The metal meshes 33 and 34 can be mounted to the outer peripheral portions 32a and 32b at the opposite ends of the metal pipe 32 so as to cover the filter 3.

The charged particle beam system according to the present invention has the charged particle beam source 1, the objective lens 8 for focusing the primary beam 2, which has been accelerated and released from the beam source 1, onto the sample 10, and the deflector for scanning the focused primary beam 2 over the sample 10. The system further includes the electron detecting mechanism of the above-described structure. A scanned image is created in response to an output signal from a light detector responsive to at least any one type of electrons to be detected.

The charged particle beam system according to the modified embodiment of the invention has the accelerator tube 50 for further accelerating the primary beam 2 released from the charged particle beam source 1. The plate 5 and the energy filter 3 constituting the electron detecting mechanism are disposed inside the accelerator tube 50. The decelerating electrode 51 is provided to cause the primary beam 2 passed through the accelerator tube 50 to decelerate immediately ahead of the sample 10. The accelerator tube 50 and the plate 5 can be made equipotential.

In the present invention, it is not necessary that the electron detector for detecting only electrons of interest in orbits around the optical axis be placed above the electron detector for detecting electrons in more external orbits. Hence, it is not necessary to increase the space occupied by the charged particle optical system. Consequently, the flight distance over which the charged particle beam being the primary beam travels to the sample is prevented from being prolonged undesirably. Also, the charged particle optical system is prevented from becoming more susceptible to external disturbances.

Furthermore, in such a charged particle optical system, any field that deflects particles relative to the optical axis does not exist. Therefore, the primary beam will not be bent; otherwise, an axial misalignment would occur.

In addition, the directions in which detected electrons are deflected relative to the optical axis are uniform. This will increase the amount of signal detected in response to each type of electrons. In consequence, the detection efficiency can be improved.

Having thus described our invention with the detail and particularity required by the Patent Laws, what is desired protected by Letters Patent is set forth in the following claims.

The invention claimed is:

1. An electron detecting mechanism comprising:
  a plate having an opening located on an optical axis of a primary beam accelerated and released from a charged particle beam source, the opening permitting passage of the primary beam;
  first and second scintillating surfaces formed on opposite sides of the plate, the first scintillating surface facing a sample;
  an energy filter located between the charged particle beam source and the plate and having an opening permitting passage of the primary beam, the second scintillating surface facing the energy filter;
  a first light detector; and
  a second light detector;
  wherein, when the primary beam hits the sample, electrons are produced from the sample and some of them impinge as first electrons on the first scintillating surface to thereby produce first scintillation light detected by the first light detector and, at the same time, some of the electrons produced from the sample pass through the opening in the plate, are repelled by the energy filter, and impinge as second electrons on the second scintillating surface to thereby produce second scintillation light detected by the second light detector.

2. An electron detecting mechanism as set forth in claim 1, wherein the first and second scintillating surfaces of said plate are tilted at angles of 40 to 50 degrees to the optical axis of the primary beam.

3. An electron detecting mechanism as set forth in any one of claims 1 and 2, wherein the first and second scintillating surfaces of said plate are formed by applying a fluorescent paint to a surface of the body of the plate that is specular or white or by adhesively bonding a fluorescent material to the surface of the body.

4. An electron detecting mechanism as set forth in any one of claims 1 and 2, wherein said plate has a body made of a conductive member to which a voltage can be applied.

5. An electron detecting mechanism as set forth in claim 4, wherein a metal pipe at ground potential is disposed in said opening of said plate, and wherein metal meshes are mounted to outer peripheral portions at opposite ends of the metal pipe so as to cover the plate.

6. An electron detecting mechanism as set forth in any one of claims 1 and 2, wherein said energy filter is made of a metal grid or metal plate to which a voltage can be applied.

7. An electron detecting mechanism as set forth in claim 6, wherein a metal pipe at ground potential is disposed in said opening of said energy filter, and wherein metal meshes are mounted to outer peripheral portions at opposite ends of the metal pipe so as to cover the energy filter.

8. A charged particle beam system comprising:
  a charged particle beam source for producing an accelerated primary beam;
  an objective lens for focusing the primary beam onto a sample;
  a deflector for scanning the focused primary beam over the sample; and
  an electron detecting mechanism of any one of claims 1 and 2;
  wherein a scanned image is created in response to an output signal from a light detector responsive to at least any one type of electrons detected by the electron detecting mechanism.

9. A charged particle beam system as set forth in claim 8, wherein there are further provided an accelerator tube for further accelerating the primary beam released from said charged particle beam source and a decelerating electrode for causing the primary beam passed through the accelerator tube to decelerate immediately ahead of the sample, and wherein said plate and said energy filter constituting said electron detecting mechanism are disposed inside the accelerator tube.

10. A charged particle beam system as set forth in claim 9, wherein said accelerator tube and said plate are at equipotential.

* * * * *